United States Patent [19]

Simon et al.

[11] Patent Number: 5,721,637
[45] Date of Patent: Feb. 24, 1998

[54] WAVELENGTH CONVERTER APPARATUS

[75] Inventors: Jean-Claude Simon, Louannec; Ivan Valiente, Caouennec; Laurent LaBlonde, Lannion, all of France

[73] Assignee: France Telecom, Paris, France

[21] Appl. No.: 565,975

[22] Filed: Dec. 1, 1995

[30] Foreign Application Priority Data

Dec. 6, 1994 [FR] France ............... 94 14639

[51] Int. Cl.[6] ................................... H01S 3/19
[52] U.S. Cl. ............ 359/344; 359/336; 359/341; 257/21
[58] Field of Search .................. 359/336, 341, 359/344, 349, 244; 257/21

[56] References Cited

U.S. PATENT DOCUMENTS 5,375,010  12/1994  Tervas et al. ............... 359/341
5,406,411   4/1995  Butter et al. ............... 359/341

OTHER PUBLICATIONS

Tervas et al, Proc. 3rd Tap. actg. of Opt. Amp., FB2, Jun. 26, 1992, pp. 162–165.

*Primary Examiner*—Nelson Moskowitz
*Attorney, Agent, or Firm*—Blakely Sokoloff Taylor & Zafman

[57] ABSTRACT

The invention relates to a wavelength conversion apparatus for transmitting data carried by an incident pump wave beam of wavelength $\lambda$ to a probe wave of wavelength $\lambda_r$. The apparatus has two semiconductor optical amplifiers and means for splitting the incident pump wave beam so as to inject a respective secondary pump wave beam into each of said optical amplifiers, said optical amplifiers are connected in series on the path of the probe wave so that each of them modulates said wave in intensity with the corresponding secondary pump wave beam by means of a crossover gain-saturation phenomenon.

10 Claims, 3 Drawing Sheets

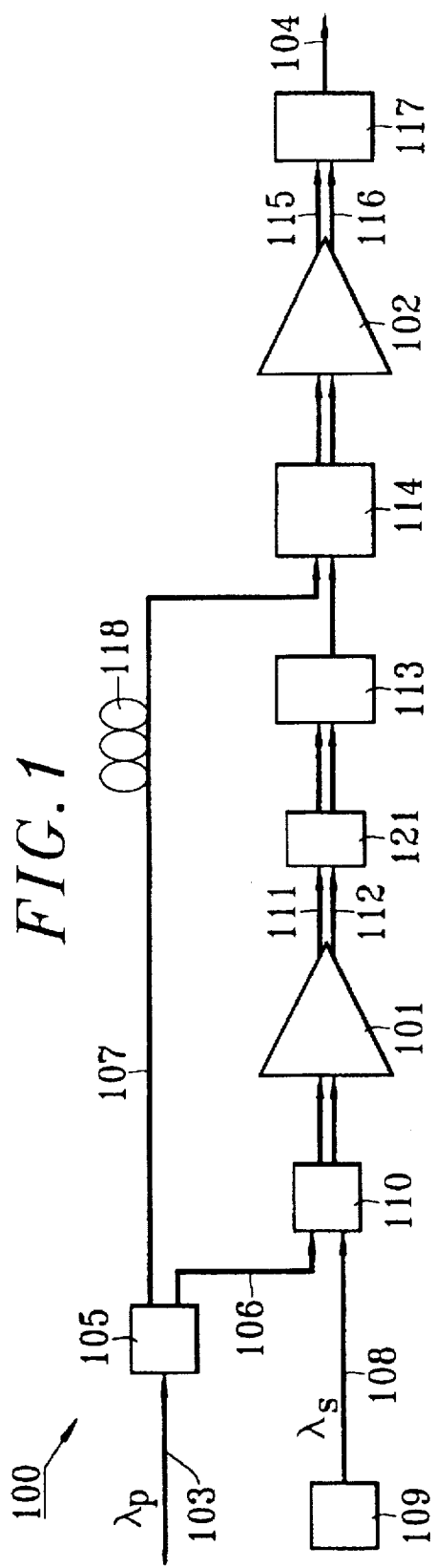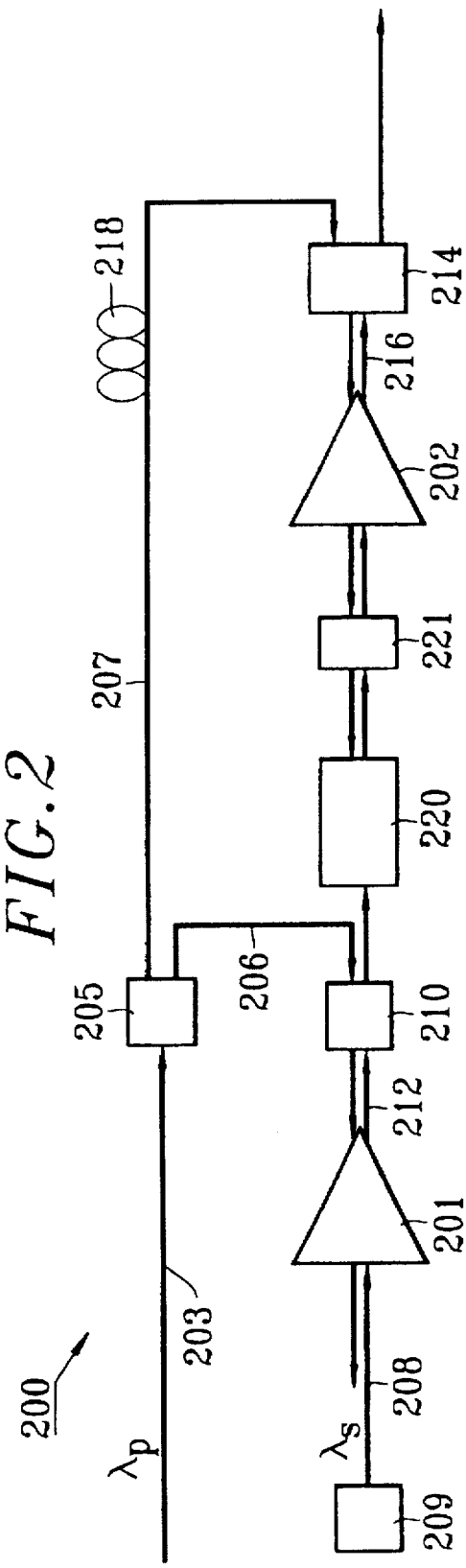

WAVELENGTH CONVERTER APPARATUS

The present invention relates to the field of optical apparatuses and more particularly to that of wavelength converters using semiconductor optical amplifiers.

BACKGROUND OF THE INVENTION

Wavelength converters are intended for use in "multi-color" telecommunications networks for conveying data carried by a first light wave to a second light wave whose wavelength is selected as a function of a particular receiver to be reached within a telecommunications network where optical signal routing depends on wavelength value.

U.S. Pat. No. 5,264,960 proposes a wavelength converter that makes use of the "crossover gain-saturation phenomenon" in a semiconductor optical amplifier. The amplifier receives a primary or "pump" light wave of wavelength $\lambda_p$ that is intensity modulated in such a manner as to carry data, e.g. in the form of a binary signal, and a secondary or "probe" light wave of wavelength $\lambda_s$ to which the data carried by the pump wave is to be transmitted. Because of the saturation phenomenon, the high intensity level of the pump wave, representative of binary state "1" reduces the number of electron carriers available in the semiconductor optical amplifier for amplifying the probe wave, thereby reducing the gain of the optical amplifier with respect to the probe wave. Since amplification of the probe wave varies inversely with variation in the intensity of the pump wave, it is possible to apply a probe wave of constant intensity to the optical amplifier and obtain at the outlet from the optical amplifier a probe wave that carries the same data as the pump wave. However, the low level of intensity in the probe wave leaving the optical amplifier and representing binary state "0" is not zero, and it tends to increase with increasing binary data rate, thereby reducing contrast, i.e. the ratio between the low and high intensity levels that respectively represent binary state "0" and binary state "1" in the probe wave, which effect is also known as the "extinction ratio".

It is desirable to improve contrast at high data rates (typically greater than 2.5 Gbit/s), and wavelength converters have been proposed that do not make use of crossover gain saturation, but instead make use of phase shifts in the probe wave that are induced by variations in the intensity of the pump wave in the optical amplifier. Converters making use of probe wave phase-shifting have thus been described in "IEEE Photonics Technology Letters", Vol. 6, No. 1, January 1994, pp. 53–55, and in "Twentieth European Conference on Optical Communication, Post-deadline Paper", page 67, which makes use of Mach-Zehnder or Michelson interferometers. Although the extinction ratio is improved compared with known inverters using the crossover gain-saturation phenomenon, unfortunately the optical passband is narrower and the converters described in the above publications require accurate control of the path length difference between the interfering rays (to within one-tenth of a wavelength). Such converters are therefore difficult to implement.

OBJECTS AND SUMMARY OF THE INVENTION

The present invention provides improved apparatus for converting wavelength, comprising at least two semiconductor optical amplifiers, the apparatus being intended to convey data carried by an incident pump wave beam of wavelength $\lambda_p$ to a probe wave of wavelength $\lambda_s$. The apparatus of the invention includes means for splitting the incident pump wave beam into secondary pump wave beams and for injecting a respective secondary pump wave beam into each of said optical amplifiers, and said optical amplifiers are disposed in series on the path of the probe wave so that each of them modulates the intensity thereof by the crossover gain-saturation phenomenon with the associated secondary pump wave beam, for the purpose of obtaining at the output from the apparatus a probe wave that carries said information. Thus, at the output from the converter apparatus, the invention provides a probe wave having an extinction ratio that is improved compared with the extinction ratio that would be obtained with any one of said optical amplifiers used on its own. More particularly, if the extinction ratio of the probe wave at the output from an optical amplifier used in isolation is $\eta$, then the extinction ratio at the outlet of conversion apparatus comprising N identical optical amplifiers connected in series in accordance with the invention is, to a first approximation, equal to $\eta^N$.

In an embodiment of the invention, at least one of the secondary beams of the pump wave is applied to the associated optical amplifier in a direction of propagation that is opposite to that of the probe wave. Advantageously, the apparatus includes an optical isolator placed on the path of the secondary pump wave beam at the outlet from the optical amplifier that receives it in a propagation direction opposite to that of the probe beam, said optical isolator being organized to stop said secondary pump wave beam while passing said probe beam.

In an embodiment of the invention, all of the optical amplifiers receive the associated pump wave secondary beam in a propagation direction that is opposite to that of the probe wave.

Advantageously, the apparatus is integrated in a structure that is monolithic or hybrid. The term "monolithic structure" is used to designate a structure in which components are made on a common substrate and the term "hybrid structure" is used to designate a structure comprising a common support on which components are assembled.

Advantageously, the apparatus includes an attenuator placed on the path of the probe beam between the two optical amplifiers through which the probe beam passes in succession, in such a manner that the intensity of the probe beam applied to each of the optical amplifiers has the same peak amplitude.

Advantageously, the apparatus includes at least one delay line disposed on the path of the secondary pump wave beam, said delay line being organized so that the data carried by each of said secondary pump wave beams reaches the associated optical amplifiers synchronously with the data carried by the probe wave.

In an embodiment of the invention, the apparatus includes at least one filter placed on the path of the probe wave at its outlet from an optical amplifier, said filter being of selectivity chosen in such a manner as to stop the pump wave while allowing the probe wave to pass therethrough.

In an embodiment of the invention, the apparatus includes a light source adapted to emit a probe wave of constant intensity, to which probe wave said data is to be conveyed.

Advantageously, said data is a binary signal at a rate equal to or greater than 10 Gbit/s.

BRIEF DESCRIPTION OF THE DRAWINGS

Other characteristics and advantages of the present invention appear on reading the following non-limiting detailed description of three embodiments of the invention, and on examining the accompanying drawings, in which:

FIG. 1 is diagram of apparatus constituting a first embodiment of the invention;

FIG. 2 is a diagram of apparatus constituting a second embodiment of the invention;

MORE DETAILED DESCRIPTION

Figure 3:
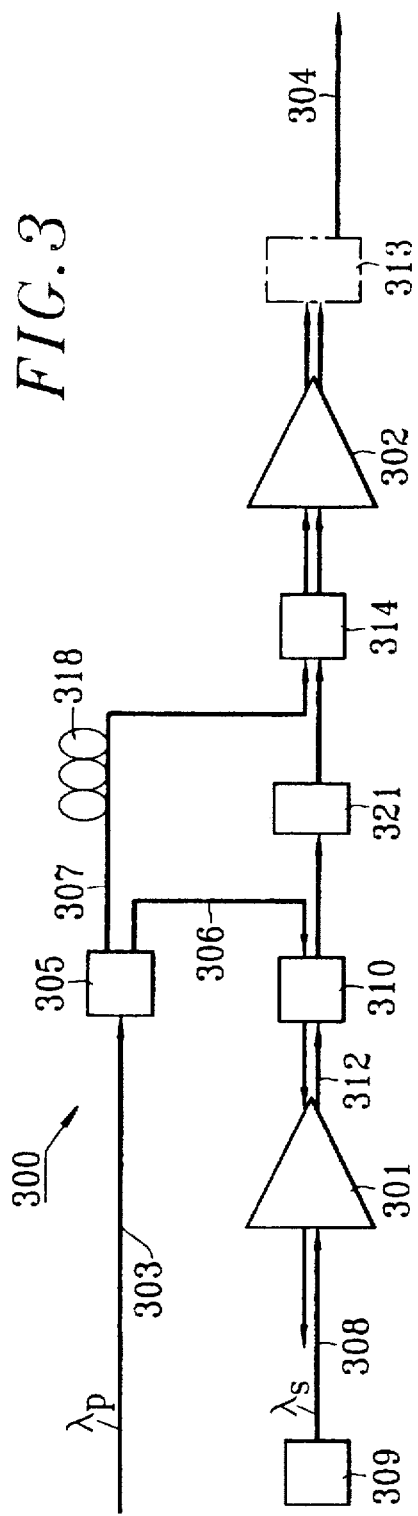
FIG. 3 is a diagram of apparatus constituting a third embodiment of the invention.

Apparatus of the invention and as shown in FIGS. 1 to 3 comprises, in each case, two semiconductor optical amplifiers. Naturally the invention can be generalized without difficulty to apparatus comprising an arbitrary number N (greater than or equal to two) of semiconductor optical amplifiers.

The converter apparatus 100 shown in FIG. 1 uses two semiconductor optical amplifiers 101 and 102 that are identical and known per se. The apparatus 100 receives a pump wave 103 of wavelength $\lambda_p$ at its input, which wave is intensity modulated so as to convey data, e.g. in the form of a binary signal at a high data rate, typically greater than 10 Gbit/s. For example, the pump wave 103 conveyed to the apparatus 100 in conventional manner by an optical fiber may come from an emitter in a first telecommunications local area network (LAN). At its output, the apparatus 100 delivers a probe wave 104 of wavelength $\lambda_s$ that is different from $\lambda_p$, which probe wave then carries said data. The probe wave 104 is directed, for example, to a receiver in a second LAN for interconnection with the first, and routing of the probe wave 104 is determined by its wavelength $\lambda_s$. The probe wave 104 is conveyed from the apparatus 100 to the second LAN by means of an optical fiber and in a manner that is known per se.

The incident pump wave beam 103 is split into two secondary beams 106 and 107 of equal amplitude which are injected into respective semiconductor optical amplifiers 101 and 102, in a manner described in greater detail below. More particularly, the optical fiber in which the pump wave 103 propagates is connected to the input of one of two paths of a directional coupler 105 with the secondary beams 106 and 107 being picked up respectively at two output paths from the coupler 105. The secondary beams 106 and 107 are conveyed by any means known to the person skilled in the art, e.g. an optical fiber or an optical waveguide, to optical amplifiers 101 and 102. More generally, the optical components of the apparatus 100 are interconnected either by means of optical fibers when the apparatus is built up as an assembly of discrete optical components, or else by optical waveguides when the components are integrated in a structure that is monolithic or hybrid. A conventional delay line 118 is inserted in the path of one of the secondary beams 106 and 107, in a manner described in greater detail below.

A probe wave 108 of constant intensity and of wavelength $\lambda_s$ is delivered by a light source 109 of conventional design and passes in succession through both semiconductor optical amplifiers 101 and 102, which amplifiers are connected in series on the path of the probe wave 108.

The probe wave 108 and the associated pump wave secondary beam 106 are injected into the optical amplifier 101 by means of a directional coupler 110 having two input paths on which it receives the probe wave 108 and the pump wave secondary beam 106 respectively, with one of the paths having its output connected to the optical amplifier 101. The amplifier 101 provides an output beam constituted by an amplified pump wave 111 and a modulated probe wave 112. The optical amplifier 101 is designed in a manner known to the person skilled in the art so that the incident probe wave is amplified with gain that depends on the intensity of the incident pump wave, by virtue of the crossover gain-saturation phenomenon.

A conventional filter 113 tuned to $\lambda_s$ is placed on the path of the beam coming from the optical amplifier 101 so as to stop the amplified pump wave 111 while passing the modulated probe wave 112 on its own towards the optical amplifier 102.

In accordance with the invention, the optical amplifier 102 is placed on the path of the modulated probe wave 112. This optical amplifier 102 receives on its input both the secondary beam 107 of the pump wave coming from the same pump wave incident beam 103 as the pump wave secondary beam 106 that is received by the other amplifier 101; more precisely, a directional coupler 114 has inputs receiving the modulated probe wave 112 on one path and the pump wave secondary beam 107 on another path. One of the paths has its output connected to the optical amplifier 102 and this amplifier provides an amplified pump wave 115 together with a modulated probe wave 116.

A filter 117 set to $\lambda_s$ is placed on the path of the beam coming from the optical amplifier 102 so as to stop the amplified pump wave 115 and pass only the modulated probe wave 116 that leaves the apparatus 100. Reference 104 designates the probe wave at the output from the filter 117. Using $\eta$ to designate the extinction ratio of the probe wave at the output from the optical amplifier 101, then the extinction ratio of the probe wave 104 at the output from the apparatus as a whole 100 is equal, to a first approximation, to $\eta^2$. With N stages, the extinction ratio is equal, to a first approximation, to $\eta^N$.

When the probe wave 108 passes through the optical amplifier 101 it is amplified; a conventional attenuator 121 is placed on the path of the modulated probe wave 112 coming from the optical amplifier 101 so that the peak intensity of the modulated probe wave 112 as applied to the optical amplifier 102 is the same as the peak intensity of the probe wave 108 applied to the optical amplifier 101. The delay line 118 placed on the path of the secondary beam 107 of the pump wave is selected so that the data carried by the secondary beam 107 of the pump wave arrives synchronously with the data carried by the modulated probe wave 112 applied to the amplifier 102, with account being taken of the delay associated with the probe wave 108 passing through the optical amplifier 101 and the various optical components.

In the apparatus 100, the pump wave and the probe wave propagate through each of the optical amplifiers 101 and 102 in the same direction, in a "co-propagating" configuration.

In a variant, as shown in FIG. 2, it is possible to implement converter apparatus 200 in which the pump wave and the probe wave propagate in opposite directions through each of the optical amplifiers, in a "contra-propagating" configuration.

The apparatus 200 receives a pump wave 203 and splits it into two secondary beams 206 and 207 by means of a directional coupler 205 in the same manner as the above-described apparatus 100.

A probe wave 208 of constant intensity as delivered by a light source 209 is injected directly into an optical amplifier 201. The amplifier delivers at its output a modulated probe wave 212. The optical amplifier 201 is connected to one of the paths of a directional coupler 210 which is organized to recover the modulated probe wave 212 leaving the amplifier 201 and to inject the secondary beam 206 of the pump wave in a propagation direction that is opposite that of the probe wave 208. The coupler 210 has a path receiving at its input the secondary wave 206 while the other path of the coupler 210 receives at its input the modulated probe wave 212 leaving the optical amplifier 201, and at its output it applies the modulated probe wave 212 to the optical amplifier 202. In accordance with the invention, this amplifier is placed on the path of the modulated probe wave 212 that comes from the optical amplifier 202. The optical amplifier 202 receives the secondary beam 207 of the pump wave in the propagation direction opposite to that of the modulated probe wave 212. The secondary beam 207 of the pump wave is injected into the optical amplifier 202 via a directional coupler 214. This coupler has a path whose input receives the secondary beam 207 of the pump wave; its other path has its input receiving the modulated probe wave 216 coming from the amplifier 202. A conventional delay line 218 is placed on the path of the secondary beam 207 to compensate for the delay associated with the probe wave 208 passing through the optical amplifier 201 and the various optical components so that the data carried by the secondary beam 207 of the pump wave arrives synchronously with the data carried by the modulated probe wave 212 applied to the optical amplifier 202. The modulated probe wave leaving the apparatus 200 is referenced 204.

A conventional attenuator 221 is placed on the path of the modulated probe wave 212 so that the peak amplitude of the probe wave that is applied to each of the optical amplifiers 201 and 202 is the same.

The apparatus 200 has the advantage over the above-described apparatus 100 of making it possible to use an optical isolator 220 instead of a filter for stopping the pump wave that emerges from the amplifier 202 heading towards the amplifier 201. The conventional isolator 220 is transparent in the propagation direction of the probe wave 212 emerging from the optical amplifier 201 and is non-transparent in the opposite direction of propagation which corresponds to propagation of the pump wave beam that emerges from the optical amplifier 202. By using an optical isolator, i.e. a passive component, a particular advantage is achieved compared with the use of a filter, i.e. an active component, of not requiring any tuning control system for setting the desired wavelength.

The converter apparatus 300 shown in FIG. 3 has two identical optical amplifiers 301 and 302 and it combines the co-propagating and contra-propagating configurations. The apparatus 300 receives at its input a pump wave 304 which is split into two secondary waves 306 and 307 by means of a directional coupler 305, as in the preceding embodiments.

An optical source 309 delivers a probe wave 308 of constant intensity which is applied directly to the optical amplifier 301. The secondary beam 306 of the pump wave is injected into the optical amplifier 301 in the direction opposite to the propagation direction of the probe wave 308 via a directional coupler 310 which is connected in the same manner as the coupler 210 of the preceding embodiment. The optical amplifier 302 is connected on the path of the modulated probe wave 312 coming from the optical amplifier 301. A directional coupler 314 is used to inject both the modulated probe wave 312 and the secondary beam 307 of the pump wave in the same propagation direction into the optical amplifier 302. More precisely, the coupler 314 has one path whose input receives the modulated probe wave 312 and another path that receives the secondary beam 307 of the pump wave, one of the paths of the coupler 314 having its output connected to the amplifier 302.

A filter 313 is placed on the path of the beam coming from the optical amplifier 302 to stop the pump wave and to apply to the output of the apparatus 100 only the modulated probe wave, given reference 304. An attenuator 321 is placed on the path of the modulated probe wave 312 leaving the optical amplifier 301 so that the peak amplitude of the probe wave applied to the optical amplifier 302 is the same as the peak amplitude of the probe wave 308 applied to the optical amplifier 301. A delay line 318 is placed on the path of the secondary beam 307 of the pump wave so as to synchronize the data carried by the secondary beam 307 of the pump wave with the data carried by the modulated probe wave 312, so as to take account of the delay due to passing through the optical amplifier 301 and the various optical components.

The apparatus 300 is advantageously integrated within a monolithic structure, however the filter 313 may be mounted in the form of a discrete component at the output from the amplifier 302.

Figure 5:
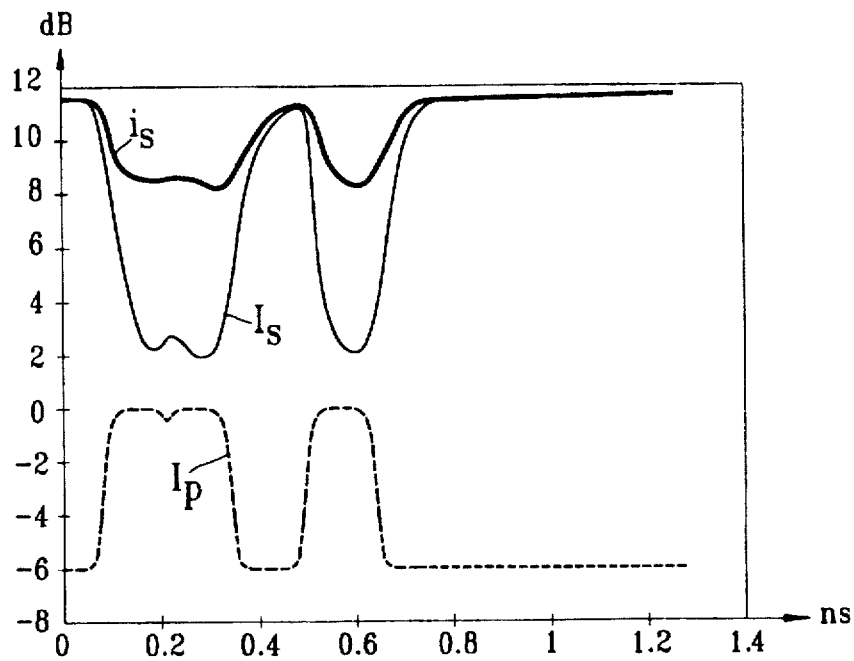
FIGS. 4 and 5 are graphs showing results obtained by simulation.
Figure 4:
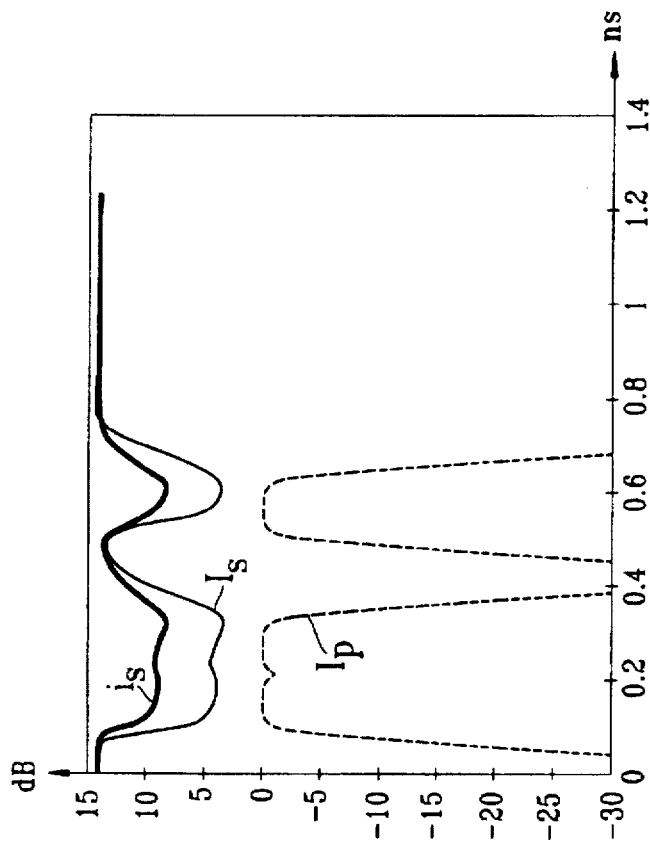

FIGS. 4 and 5 show results obtained by simulation. FIG. 4 shows the simulated response of a device of the invention (in the two-stage contra-propagating configuration of the kind described with reference to FIG. 2) when a pump wave of intensity $I_p$ is injected into the input (for an extinction ratio of the pump wave greater than 30 dB). By way of comparison, the intensity of a probe wave at the output of a known converter that uses only a single optical amplifier is marked $i_r$, and the intensity of a probe wave coming from the apparatus of the invention is marked $I_r$. It will be observed that the invention causes the extinction ratio of the probe wave to go from 5.2 dB to 10.6 dB, with the total power of the pump wave nevertheless being twice that of a known converter using only one optical amplifier. However, even when the total power of the pump wave is identical to that of a conventional configuration using only one optical amplifier, a configuration of the present invention using a plurality of optical amplifiers nevertheless improves the extinction ratio by at least 2 dB.

FIG. 5 shows results of simulation of a three-stage converter apparatus of the invention that receives a pump wave of intensity $I_p$ modulated to carry a binary signal and having an extinction ratio of only 6 dB. For comparison purposes, the intensity $i_s$ of the probe wave is shown for a conventional converter using only one optical amplifier, as is the intensity $I_s$ of the probe wave that leaves a converter apparatus of the invention. It will be observed that apparatus of the invention is capable of providing an additional 3 dB of contrast in the data carried by the incident pump wave.

Figure 6:
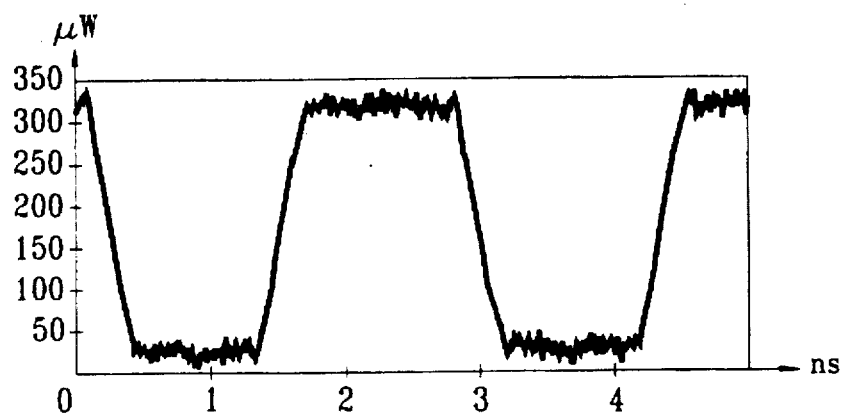
FIGS. 6 and 7 are the corresponding results obtained experimentally using apparatus of the invention.
Figure 7:
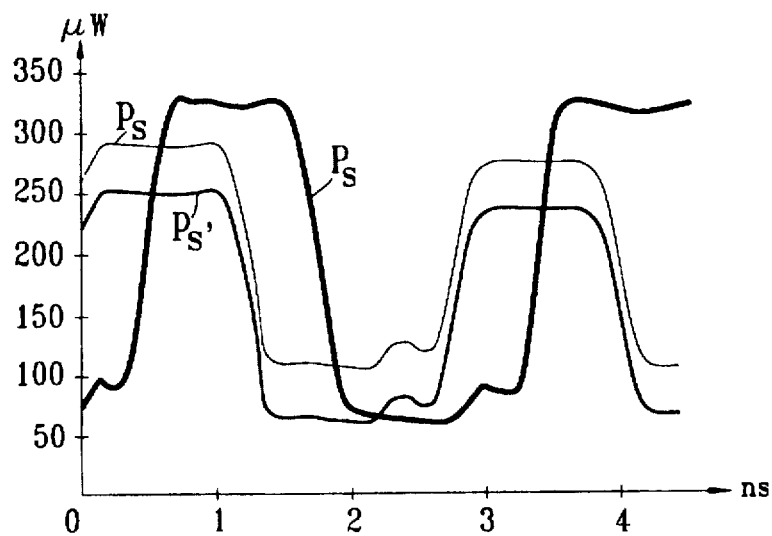

FIGS. 6 and 7 combine experimental results from an embodiment of the kind described with reference to FIG. 2. As an indication, the pump wave was generated in this case by a DFB type laser for which $\lambda_p$=1553 nm, which lambda was modulated in intensity so as to carry a pseudo-random digital signal. In this case the probe wave was generated by a DFB laser having $\lambda_s$=1540 nm. FIG. 6 shows how the power of the pump wave varied at a rate of 700 Mbit/s. FIG. 7 shows the appearance of the power $P_s$ of the probe wave at the output from the apparatus, for an extinction ratio of 7.2 dB. By way of comparison, there is also shown the appearance of the power $p_s$ of the output probe wave from a conventional converter having one stage only: the extinction ratio is 4.14 dB. Curve $p_s'$ shows the appearance of the power of the probe wave from a conventional converter having a single stage but for a pump wave power equal to the power of the pump wave incident beam for a converter of the invention having two stages: the invention still provides a better extinction ratio (7.2 dB instead of 6.06 dB).

In conclusion, the invention makes it possible to obtain a clear improvement in the extinction ratio of the probe wave without making a compromise between the data transmission speed and the resulting extinction ratio. Apparatus of the invention is also more robust than interferometer apparatus as proposed in the prior art since it does not require accurate control of a path length difference. For the same reason, and taking account of the fact that the phase velocity of a wave in a semiconductor optical amplifier depends in general on the polarization of the wave, the sensitivity of the present invention to polarization in the probe wave is not critical, compared with the sensitivity of known converters that make use of Mach-Zehnder or Michelson interferometers. In addition, the optical passband is limited in the invention only by that of the optical amplifier and not by that of the interferometer used in a known converter that makes use of probe wave phase shifting.

We claim:

1. Wavelength conversion apparatus for conveying data carried by an incident pump wave beam of wavelength $\lambda_p$ to a probe wave of Wavelength $\lambda_s$, the converter apparatus comprising at least two semiconductor optical amplifiers wherein the apparatus includes means for splitting the incident pump wave beam into secondary pump wave beams and for injecting a respective secondary pump wave beam into each of said optical amplifiers, and wherein said optical amplifiers are disposed in series on the path of the probe wave so that each of them modulates the intensity thereof by the crossover gain-saturation phenomena with the associated secondary pump wave beam, for the purpose of obtaining at the output from the apparatus a probe wave that carries said information.

2. Apparatus according to claim 1, wherein at least one of the secondary beams of the pump wave is applied to the associated optical amplifier in a direction of propagation that is opposite to that of the probe wave.

3. Apparatus according to claim 2, including an optical isolator placed on the path of the secondary pump wave beam at the outlet from the optical amplifier that receives it in a propagation direction opposite to that of the probe beam, said optical isolator being organized to stop said secondary pump wave beam while passing said probe beam.

4. Apparatus according to claim 2, wherein all of the optical amplifiers receive the associated pump wave secondary beam in a propagation direction that is opposite to that of the probe wave.

5. Apparatus according to claim 1, wherein it is integrated in a structure that is monolithic or hybrid.

6. Apparatus according to claim 1, including an attenuator placed on the path of the probe beam between the two optical amplifiers through which the probe beam passes in succession, in such a manner that the intensity of the probe beam applied to each of the optical amplifiers has the same peak amplitude.

7. Apparatus according to claim 1, including at least one delay line disposed on the path of the secondary pump wave beam, said delay line being organized so that the data carried by each of said secondary pump wave beams reaches the associated optical amplifiers synchronously with the data carried by the probe wave.

8. Apparatus according to claim 1, including at least one filter placed on the path of the probe wave at its outlet from an optical amplifier, said filter being of selectivity chosen in such a manner as to stop the pump wave while allowing the probe wave to pass therethrough.

9. Apparatus according to claim 1, including a light source adapted to emit a probe wave of constant intensity, to which probe wave said data is to be conveyed.

10. Apparatus according to claim 1, wherein said data is a binary signal at a rate equal to or greater than 10 Gbit/s.

* * * * *